United States Patent [19]
Rose et al.

[11] Patent Number: 5,537,341
[45] Date of Patent: Jul. 16, 1996

[54] COMPLEMENTARY ARCHITECTURE FOR FIELD-PROGRAMMABLE GATE ARRAYS

[75] Inventors: Jonathan Rose, 215 Howland Avenue, Toronto, Canada, M5R 3B7; Vaughn Betz, 10 Passy Crescent, North York, Canada, M3J 3K9

[73] Assignees: Jonathan Rose; Vaughn Betz, both of Toronto, Canada

[21] Appl. No.: 387,402

[22] Filed: Feb. 10, 1995

[51] Int. Cl.$^6$ .................................................. G06F 17/00
[52] U.S. Cl. ............................................................ 364/579
[58] Field of Search .................................. 364/579, 578, 364/488, 489

[56] References Cited

U.S. PATENT DOCUMENTS

| | | | |
|---|---|---|---|
| 5,036,473 | 7/1991 | Butts et al. | 364/489 |
| 5,109,353 | 4/1992 | Sample et al. | 364/579 |

OTHER PUBLICATIONS

Quickturn; "RPM Emulation System" 1991.
Walters et al; "Reprogrammable Hardware Emulation Automates System-Lever ASIC Validation"; 1990.
Quickturn; "Logic Emulation For System-Level Design"; 1992.
Varghese et al; "An Efficient Logic Emulation System"; IEEE TRAN. Very Large Scale Integration (VLSI) Systems 1(2) 1993.
Butts et al; "An Efficient Logic Emulation System."; IEEE 1992.
Brown, Stephen, et al.; "A Detailed Router for Field-Programmable Gate Arrays"; *IEEE Transactions on Computer-Aided Design*; vol. 11, No. 5, May 1992; pp. 620–628.
Fawcett, Bradly K.; "Tools to speed FPGA development"; *IEEE Spectrum*; vol. 31, No. 11, Nov. 1994; pp. 88–94.
Rose, Jonathan, et al.; "Architecture of Field-Programmable Gate Arrays"; *Proceedings of the IEEE*; vol. 81, No. 7; Jul. 1993; pp. 1013–1029.
Trimberger, Stephen; "A Reprogrammable Gate Array and Applications"; *Proceedings of the IEEE*; vol. 81, No. 7; Jul. 1993; pp. 1030–1041.
Greene, Jonathan, et al.; "Antifuse Field Programmable Gate Arrays"; *Proceedings of the IEEE*; vol. 81, No. 7; Jul. 1993; pp. 1042–1056.
Sangiovanni-Vincentelli, Alberto, et al.; "Synthesis Methods for Field Programmable Gate Arrays"; vol. 81, No. 7; Jul. 1993; pp. 1057–1083.
Chung, Kevin, et al.; "Using Heriarchical Logic Blocks to Improve the Speed of FPGAs"; *FPGAs*; W. Moore et al., ed.; Abingdon, 1991; pp. 103–113.
Chung, Kevin; "Architecture and Synthesis of Field-Programmable Gate Arrays with Hard-wired Connections"; *Ph.D. Dissertation, University of Toronto*; 1992.
He, Jianshe and Jonathan Rose; "Advantages of Heterogeneous Logic Block Architectures for FPGAs"; *Custom Integrated Circuits Conference 1993*; May, 1993; pp. 7.4.1–7.4.5.
He, Jianshe; "Technology Mapping and Architecture of Heterogeneous Field-Programmable Gate Arrays"; *M.A.Sc. Thesis, University of Toronto*; 1994.

*Primary Examiner*—Ellis B. Ramirez
*Attorney, Agent, or Firm*—Majestic, Parsons, Siebert & Hsue

[57] ABSTRACT

The use of more than one field-programmable gate array design with a given logic capacity produces advantages over the use of a single field-programmable gate array design. The designs of the field-programmable gate arrays in the family are be selected so that each field-programmable gate array design advantageously implements a different type of circuit. This use can select from the family of FPGAs with the same logic capacity such that the circuits can on average be implemented faster and/or in a smaller area.

38 Claims, 10 Drawing Sheets

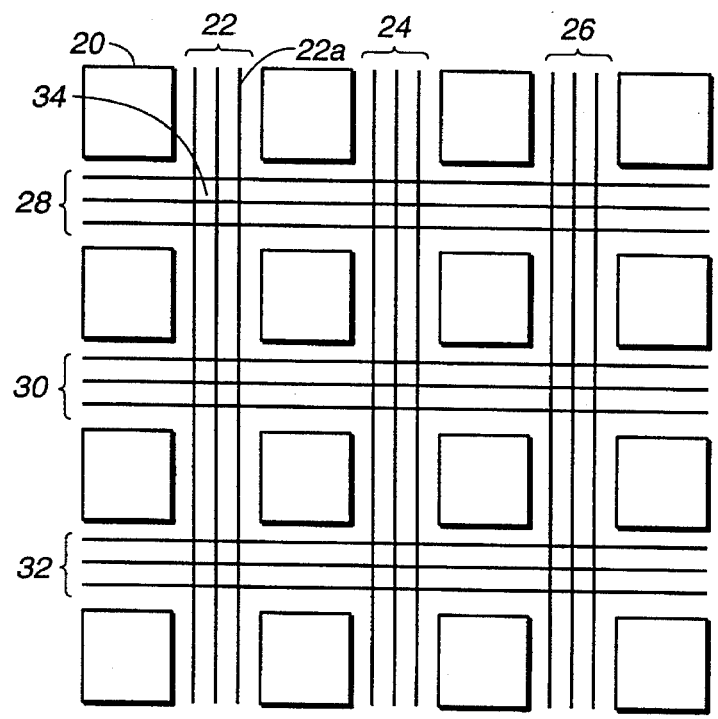
FIG._1A
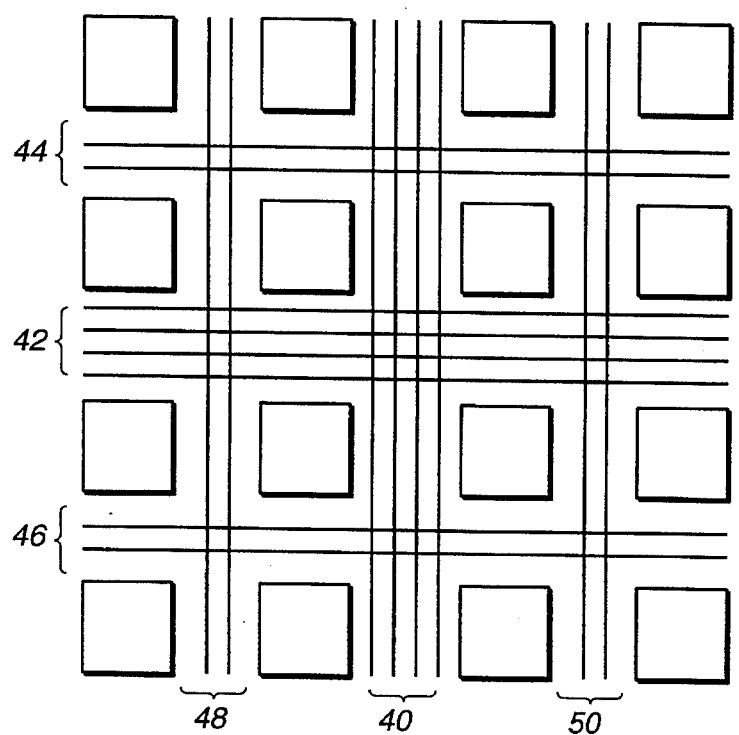
FIG._1B

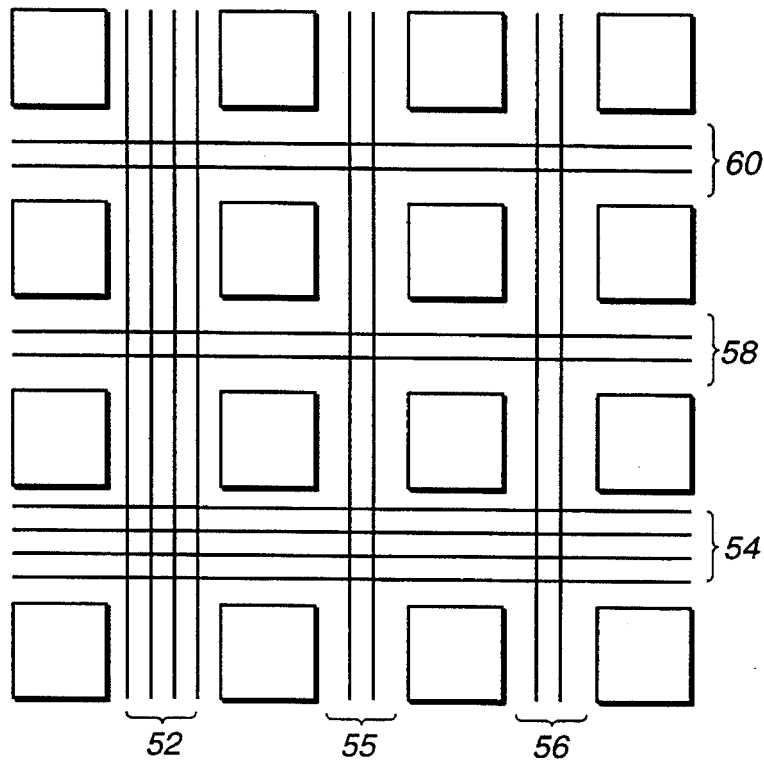
FIG._1C
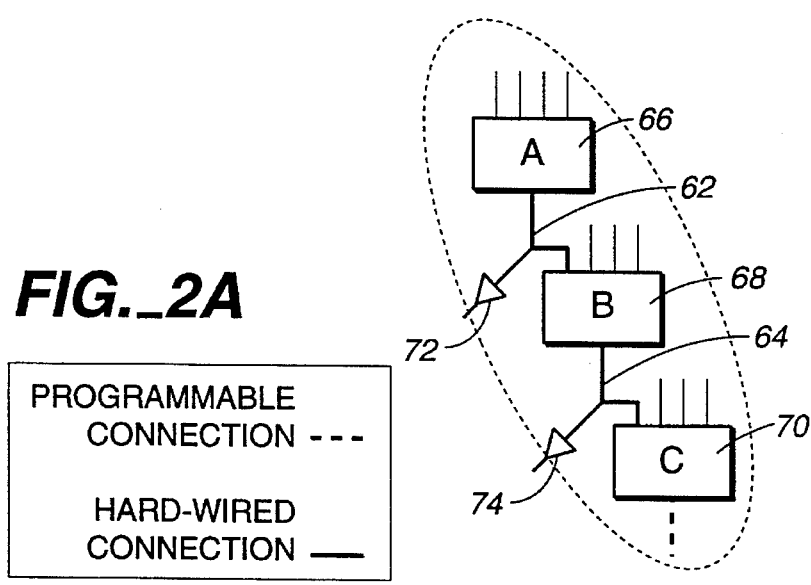
FIG._2A

FIG._2B
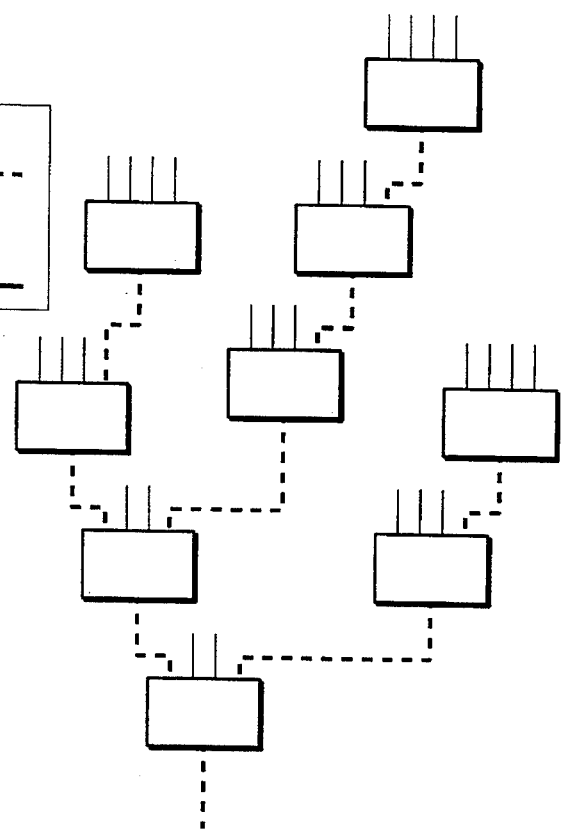
FIG._2C
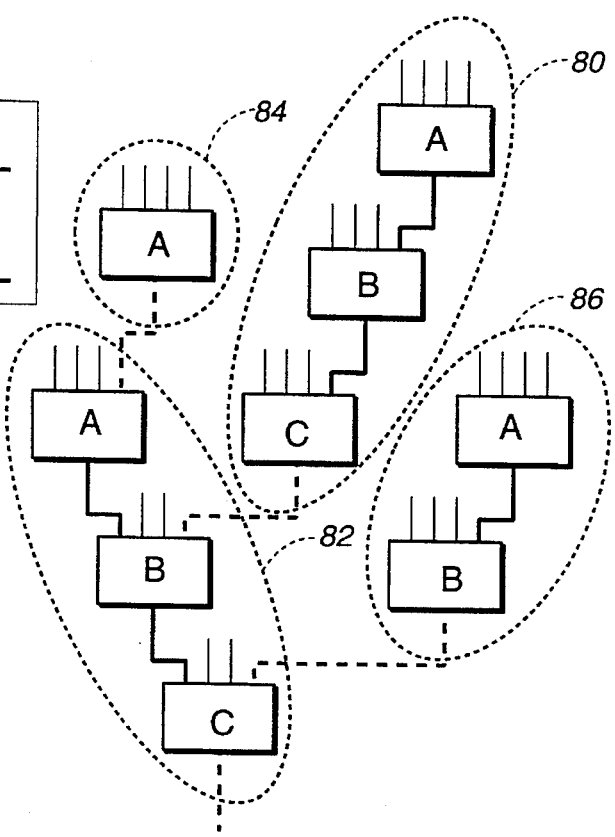

FIG._3A
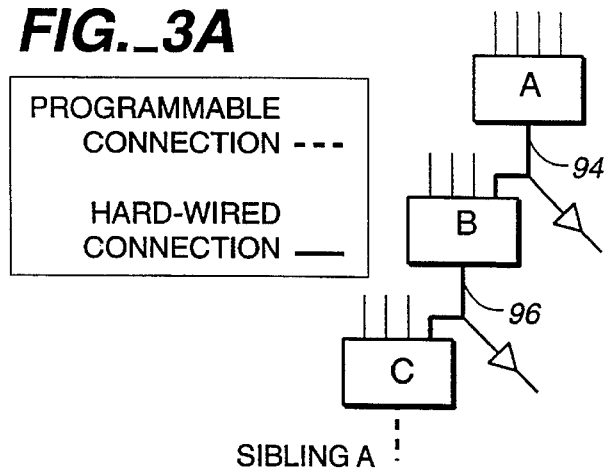
FIG._3B
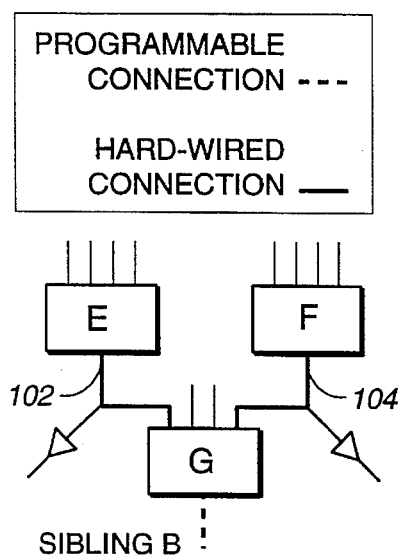
FIG._3C
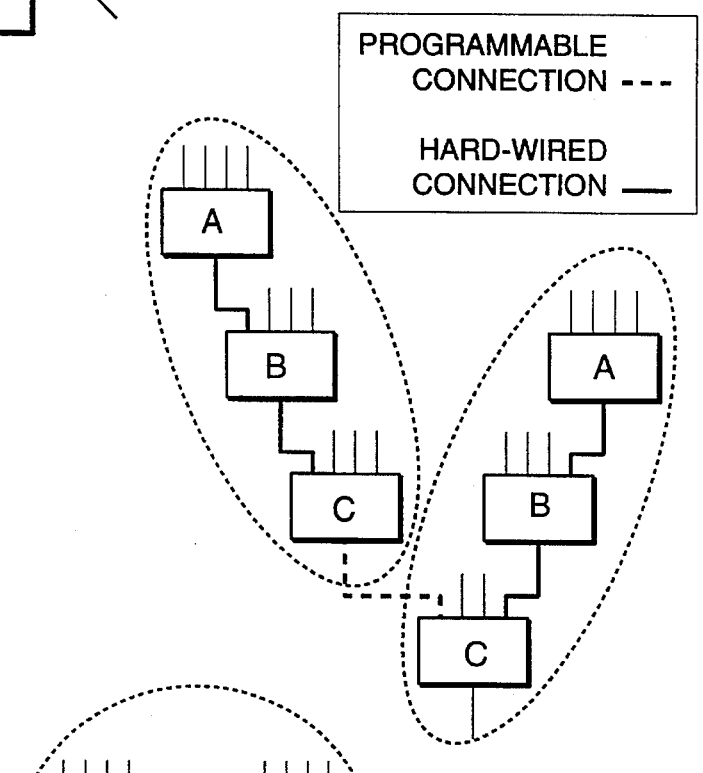
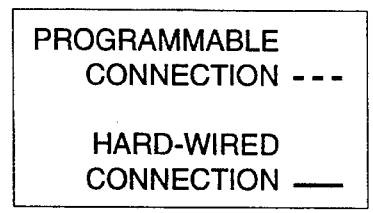
FIG._3D
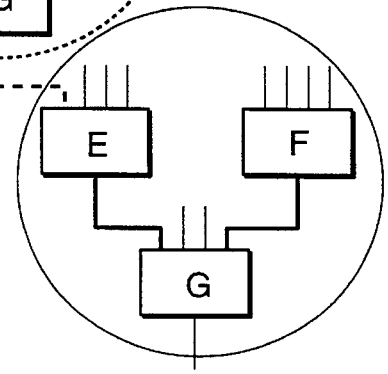

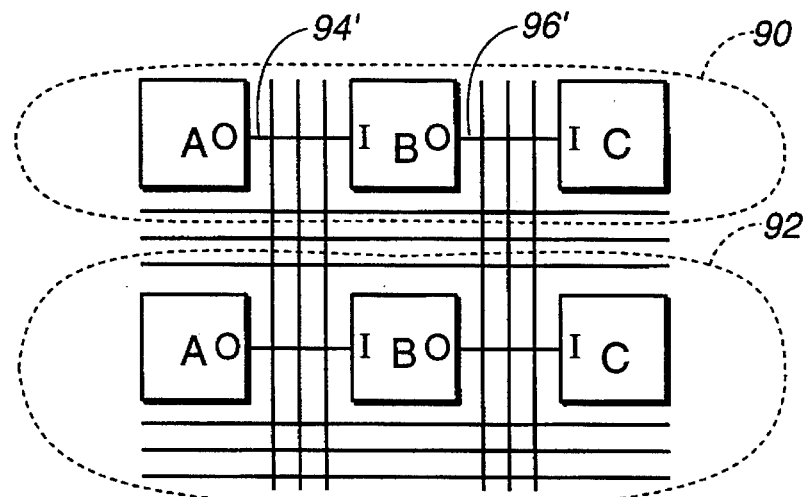
FIG._3E
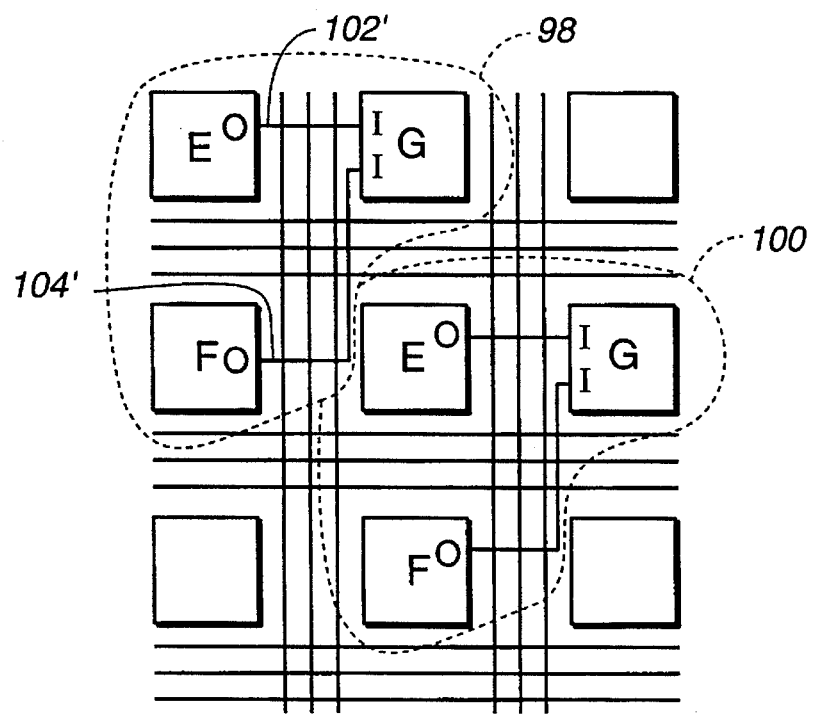
FIG._3F

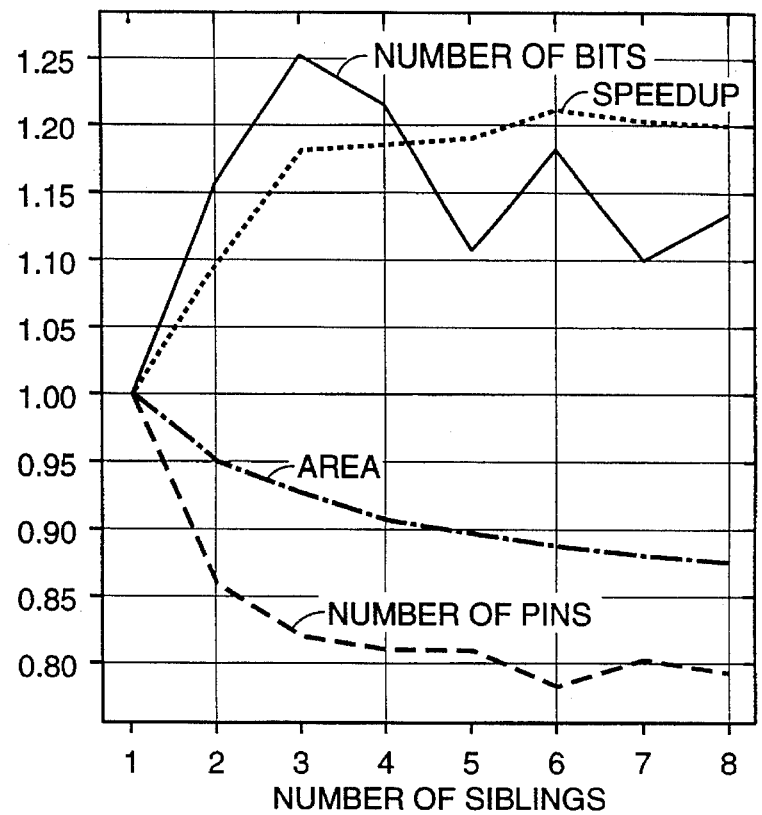
FIG._4A
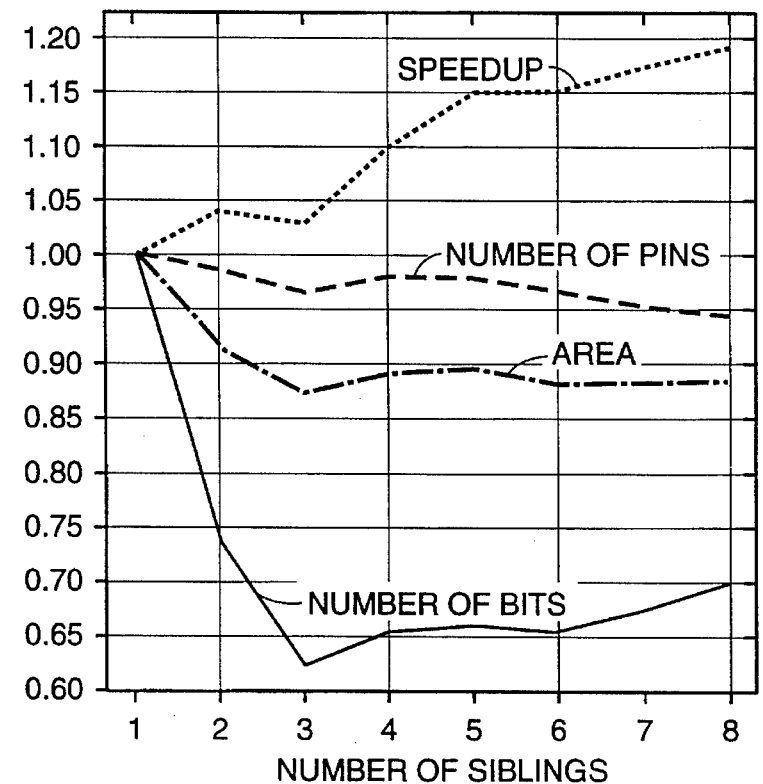
FIG._4B

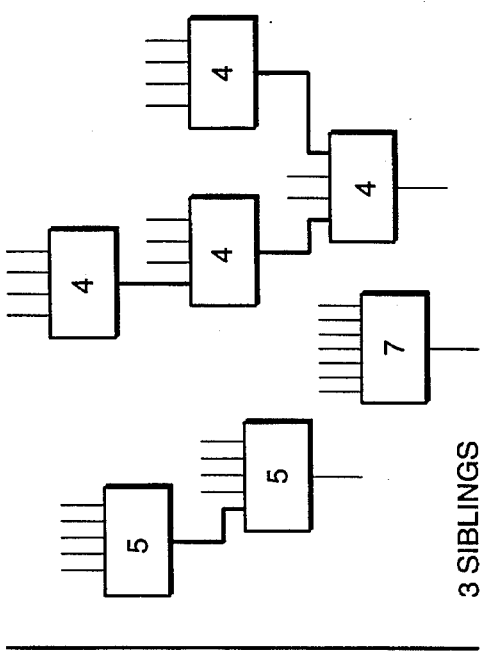
FIG._5
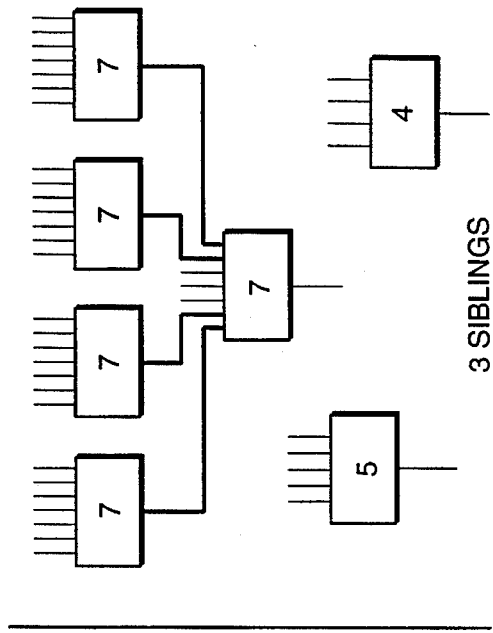
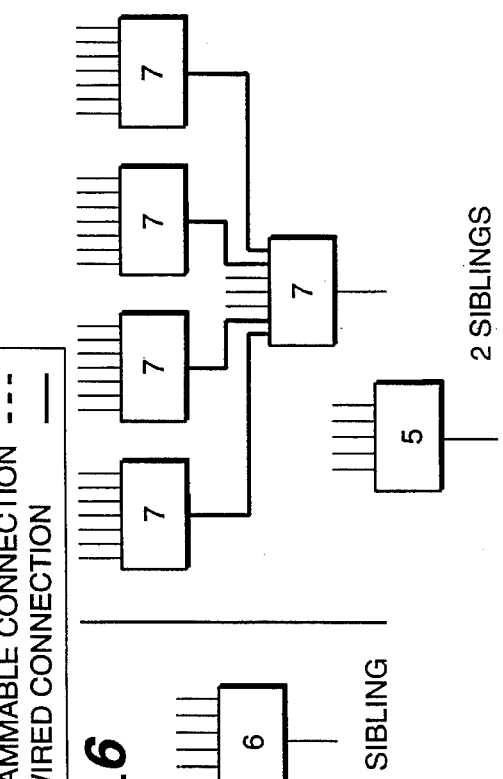
FIG._6

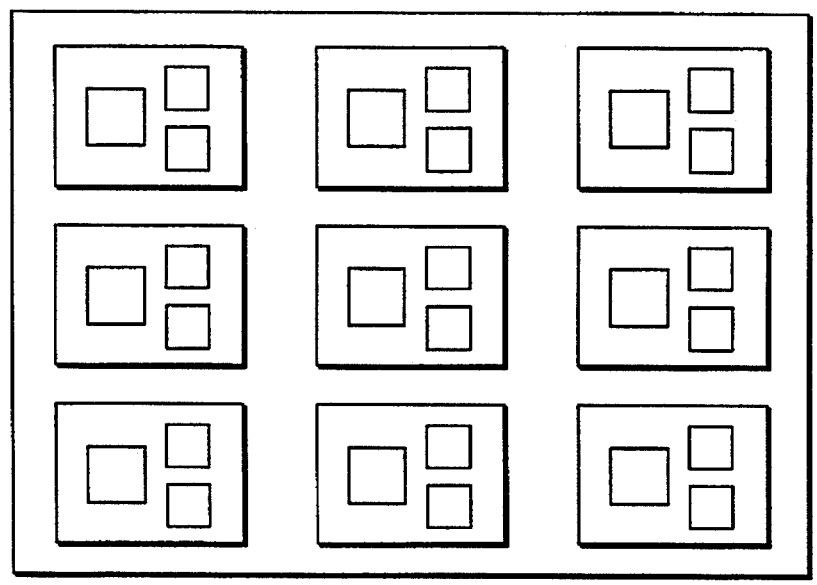
FIG._7
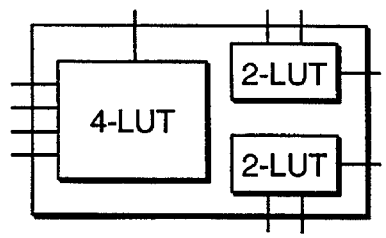
FIG._8
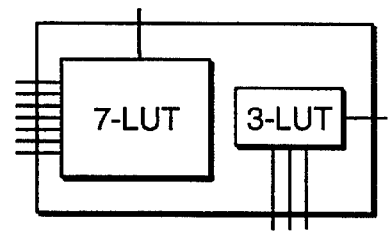
FIG._9
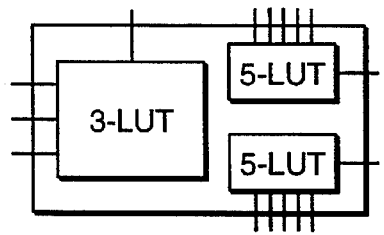
FIG._10

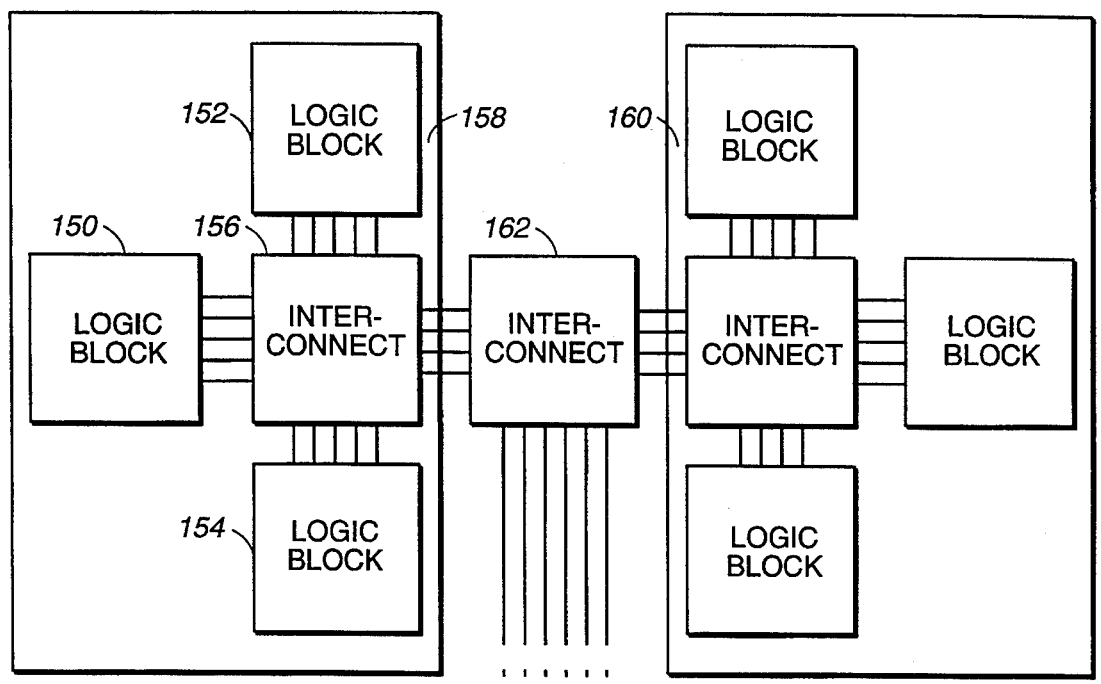
FIG._11
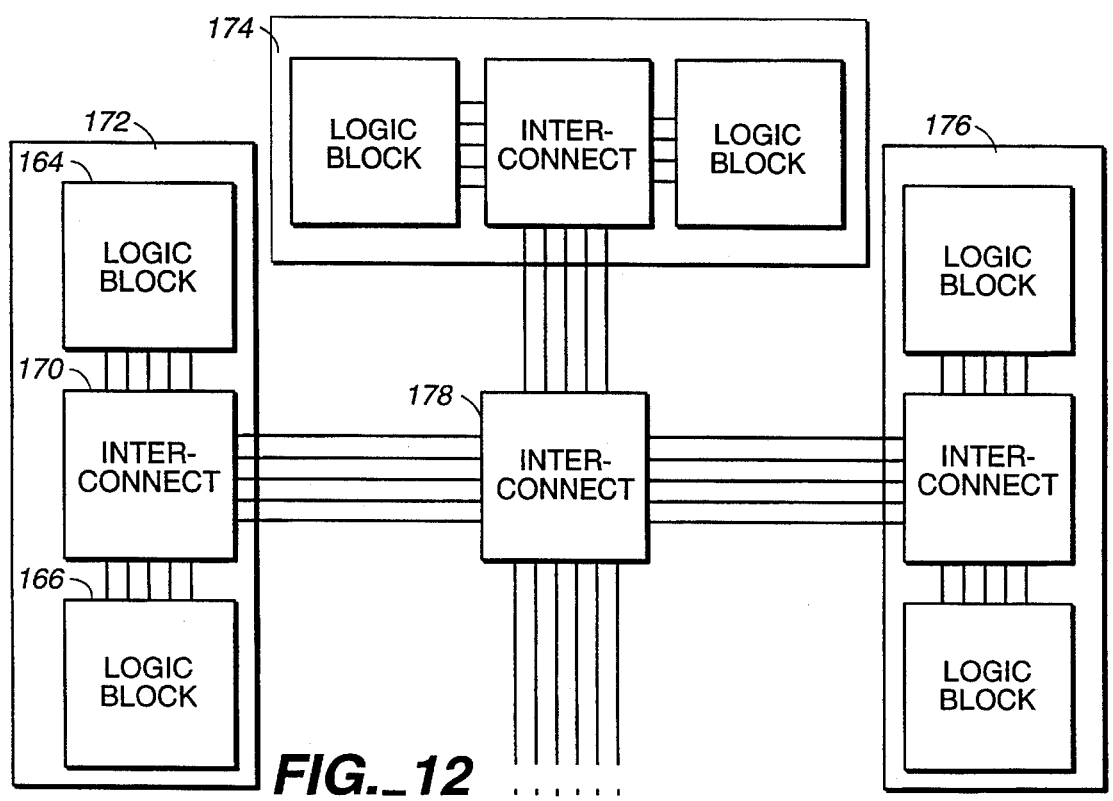
FIG._12

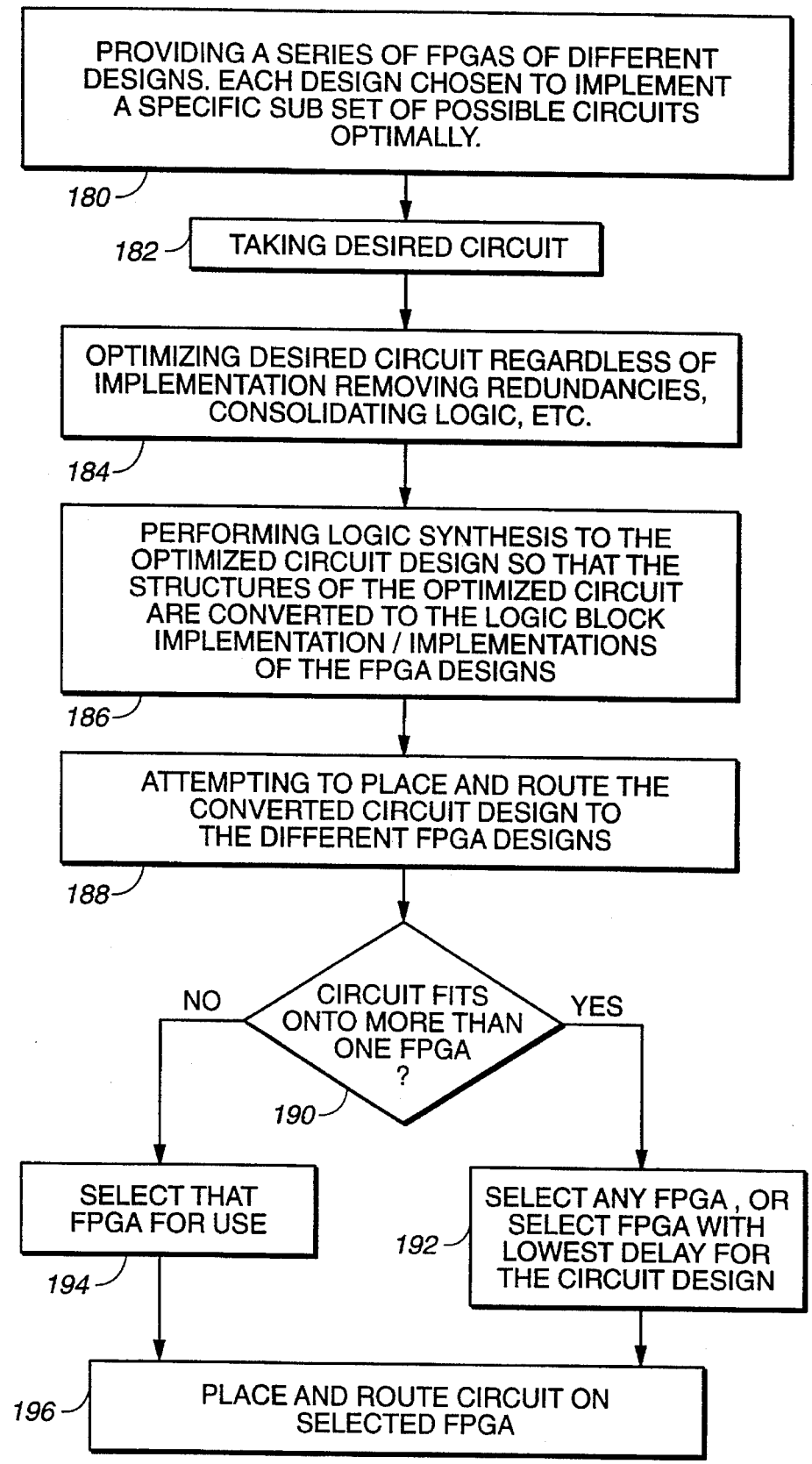
FIG._13

COMPLEMENTARY ARCHITECTURE FOR FIELD-PROGRAMMABLE GATE ARRAYS

BACKGROUND OF THE INVENTION

The present invention concerns placing circuits designs onto semiconductor chips. In particular, the present invention involves an improved method of using field-programmable gate arrays.

Currently, two common systems are used for implementing circuits on semiconductor chips. The first system uses mask-programmable gate arrays. In mask-programmable gate arrays, the circuit design is used to produce process masks that are used for the formation of chips. The masks, and thus the chip fabrication system, can only produce a single circuit. The mask-programmable gate array is optimized for this circuit, so this mask-programmable gate array can have a relatively small area and a high speed. Additionally, the mask-programmable gate arrays have good unit costs per chip for high-volume production of semiconductor chips.

The second system of implementing circuits on semiconductor chips uses field-programmable gate arrays. Field-programmable gate arrays are described in a special issue of *Proceedings of the IEEE*, Volume 81, No. 7, July 1993, which is incorporated herein by reference. Field-programmable gate arrays (FPGAs) are recently-developed electronically programmable integrated circuits. The benefit of FPGAs is that a single FPGA design can be used for implementing many circuit designs. The FPGA chips have good low-volume production costs because of the low overhead costs associated with programming the chip. FPGAs, however, are slower and have a relatively large area compared to mask-programmable chips containing a circuit of the same logic capacity. The slowness of FPGAs is generally a result of the signal paths routed through the programmable interconnect structures on the FPGA. The larger area of FPGAs is a result of the additional overhead on the chip used for programmable interconnect structures (switches with associated static memory, anti-fuses, or floating gate transistors), control logic, and under-utilized logic blocks or interconnect structures.

It is desired to have a system for implementing circuits with improved speed and/or smaller area than in previous systems for implementing a circuit onto an FPGA.

SUMMARY OF THE INVENTION

The present invention concerns the use of a family of FPGAs. A family of FPGAs comprises a number of field-programmable gate arrays with different designs. Each design is devised so as to advantageously implement a subset of circuit types. For example, some circuit types have a relatively high fan-out from a typical logic element in the circuit design. Other circuit types have fewer connections fanning out from a typical logic element in the circuit design. An advantage of using a family of FPGAs rather than a single FPGA is that the different designs of the FPGAs in the family can cover the different circuit types in advantageous fashion.

Other field-programmable gate arrays are designed such that they cover all different types of logic circuits in range of logic capacity fairly well. The prior FPGAs are not designed so that one type of logic circuits will be implemented especially well. Generally, little advantage is gained by choosing between two different companies' FPGAs to implement a given circuit design, for this reason. That is, since both companies design their field-programmable gate arrays so that they implement as many of the circuit types as possible, choosing one company's FPGA rather than another company's FPGA won't produce significant advantages for any circuit type.

The benefit of using a family of different designs of field-programmable gate arrays is that any specific design need not implement all of the circuit types. Since each design implements a specific type of circuit well, the family can be designed such that one of the FPGA designs of the family can be selected to implement any of the circuit types in a faster and/or in a smaller area than with a single field-programmable gate array which is designed to cover all of the circuit types.

At least some of the FPGA designs in the family of FPGAs are chosen such that they have about the same logic capacity. The logic capacity is generally considered to be the amount of logic on the FPGA that can be used in implementing a circuit.

The logic capacity can be compared to a general benchmark such as two input NAND gates. The arrangement and interconnection of the logic blocks in the family of FPGAs are different for each of the "siblings." The system of the present invention is distinct from choosing from a group of field-programmable gate arrays of different logic capacities in order to select the field-programmable gate array with the usable logic capacity sufficient to implement a given design.

The logic synthesis of a specific circuit design into the logic blocks of an FPGA design may be sufficient to choose the best field-programmable gate array design in the family to use for a given circuit design. More likely, the placement and routing of a circuit design for a given FPGA design should be determined in order to select the best field-programmable gate array design for that circuit design. The field-programmable gate array design that best implements the digital circuit is selected. For example, the field-programmable gate array design that produces the fastest implemented circuit could be selected. Alternatively, the field-programmable gate array that allows for the simplest routing of the circuit could be selected.

Examples of ways to produce a family of FPGA designs are given below. The first example involves using different patterns of hard-wired connections between logic blocks in the field-programmable gate array. Each sibling FPGA design can have a different pattern of hard-wired connections. The hard-wired connections remove flexibility from a circuit, since inputs of some of the logic blocks are permanently connected to the output of some of the other logic blocks. The advantage of using hard-wired connections is that these connections may increase the speed of the circuit for some circuit designs. Passing the circuit signals through the programmable interconnect switches slows down the circuit. Hard-wired connections are especially useful for wiring a critical path of a given design. Using different patterns of hard-wired connections for different siblings allows for different types of circuits to be advantageously implemented upon the siblings. By removing the flexibility from the FPGA siblings, the siblings can implement different of the types of circuits such that they are faster or implemented on a smaller area. A best sibling can be selected for any given circuit such that all different types of circuits can be advantageously implemented on one of the FPGA siblings.

Another example of a change that can be made to an FPGA design to produce a family involves the distribution of wires in the channel interconnect. Some FPGAs have arrays of logic blocks which can be connected to horizontal and vertical tracks in channels. By changing around the distribution of the tracks in these channels, siblings can be created that can be advantageously used with different types of circuits. Some circuits may be implemented better on FPGA designs that have more tracks in the middle channels than in the side channels. Other circuits may map better to FPGA designs that have more tracks in the side channels than in the middle channels.

Additionally, the types of logic blocks can be changed. For example, different types of logic blocks with different numbers of inputs could be used on different siblings. Additionally, different ratios of the logic blocks of given types can be implemented onto the FPGA designs of different siblings.

Additionally, siblings using a hierarchical interconnect system can be arranged in different connection patterns. In a hierarchical FPGA connection system, a certain number of logic blocks are connected together into groups, and then a certain number of these groups are connected together into larger groups, and so on. The siblings of an FPGA family can be designed such that there is a different number of logic blocks or groups that are connected together on each of the levels for the different siblings. For example, one design may have two logic blocks connected with a lower-level interconnect to form a group, and three of these groups connected to the others with a higher-level interconnect. Another sibling design may have three logic blocks connected together with a lower-level interconnect to form a group, and two of these groups connected together with a higher-level interconnect.

Siblings can also be designed such that a combination of the changes is used. In particular, the combinations of the different changes can be designed so that the gains add up in the same "direction." This means that the combined changes produce a faster circuit and/or a smaller area for a given type of circuit implemented thereon.

BRIEF DESCRIPTION OF THE DRAWINGS

The above and other features and aspects of the present invention will become more apparent upon the reading of the following detailed description in conjunction with the accompanying drawings, in which:

FIG. 1A is a simplified diagram showing a logic block with tracks in interconnect channels. FIGS. 1B–1C are simplified diagrams showing siblings of a family of FPGA designs in which the distribution of the tracks in the channels are modified.

FIG. 2A is a diagram showing a group of logic blocks connected together with hard-wired links to form a group. FIG. 2B shows the interconnection of a given circuit with a completely programmable connection. FIG. 2C is a diagram of a circuit showing the interconnection of logic blocks including the hard-wired links to implement the circuit shown in FIG. 2B.

FIGS. 3A–3B are diagrams of groups of logic blocks connected by hard-wired links that are used in two different siblings of an FPGA family. FIGS. 3C–3D are diagrams of circuits which are best implemented by the sibling of FIG. 3A or 3B. FIGS. 3E–3F are diagrams showing the placement of hard-wired links between logic blocks and FPGAs for the different siblings of FIGS. 3A and 3B.

FIGS. 4A and 4B are normalized graphs of the improvements in FPGA performance and density measurements as a function of the number of siblings for (FIG. 4A) circuit technology mapped to minimize area; and (FIG. 4B) circuit technology mapped to minimize delay.

FIG. 5 is diagram showing of the hard-wired groups used in the different siblings for families of different numbers of members for the architectures designed for the area-mapped circuits.

FIG. 6 is a diagram showing of the hard-wired groups used in the different siblings for families of different numbers of members for the architectures designed for the delay-mapped circuits.

FIG. 7 is a simplified diagram of an FPGA showing the different groups of logic blocks arranged into tiles.

FIGS. 8–10 are diagrams of basic tiles that can be used for the FPGA design that are tiled in the manner of FIG. 7.

FIGS. 11–12 are partial diagrams of field-programmable gate arrays arranged in different hierarchical interconnect structures to provide two different siblings.

FIG. 13 is a flow chart of the method of the present invention.

DETAILED DESCRIPTION OF THE PREFERRED EMBODIMENT

Siblings with Different Numbers of Tracks in Channels

FIG. 1A is a simplified diagram of a field-programmable gate array showing logic blocks 20 and interconnect channels 22, 24, 26, 28, 30, 32. Each of the channels includes tracks such as track 22a. Logic blocks such as logic block 20 can be programmed such that different types of digital logic can be implemented. These logic blocks 20 can be implemented as look-up tables (LUTs), multiplexers, or other common logic gate structures. The tracks such as track 22a in channel 22 allow for the interconnection of the logic blocks such as logic block 20. The articles in the July 1993 *Proceedings of the IEEE* describe the different elements of field-programmable gate arrays. Typically, the logic blocks such as logic block 20 can be interconnected together by connecting the logic block 20 programmably to the horizontal or vertical tracks in the channels such as channel 22 or 28. The tracks in channels 22 and 28 can be interconnected together in the area 34 by an additional programmable interconnect structure. The programmable interconnect structures that connect the tracks together and the logic blocks to the tracks are not shown in FIGS. 1A–C to keep the diagram uncluttered.

The programmable interconnect structures can be implemented as switches with associated storage registers like in Xilinx devices; anti-fuses as implemented in Actel devices; or floating gate transistors as implemented in Altera devices. Also not shown is the control circuitry which allows for the loading of the storage registers associated with the switches or the programming of the anti-fuses. This control circuit typically includes an addressing circuitry (also not shown).

Software programs convert circuit design to a design compatible with the logic blocks of the field-programmable gate array. Software then can implement a circuit design onto the FPGA. This software is available from vendors of FPGAs or third-party vendors such as Synopsys, Exemplar, Viewlogic, or Neocad. Examples of this type of software are described in Faucett, "Tools to speed FPGA Development," *IEEE Spectrum*, Vol. 31, No. 11, November 1994, incorporated herein by reference. The diagram of FIG. 1A is further simplified because real FPGAs typically have a greater number of logic blocks than is shown.

Note that, in FIG. 1A, the number of tracks in each of the channels 22, 24, 26, 28, 30 and 32 is the same. This is a common arrangement for currently available field-programmable gate arrays, since it provides the greatest generality of interconnection of the logic blocks. If only one field-programmable gate array design is available for use, it is desirable that this one field-programmable gate array be usable for all types of circuits. Note that not every logic block can be connected with every other logic block at the same time. The tracks can only contain one output at a time. The connectivity of the logic blocks is limited by the interconnection scheme. This means that the usable logic of a given field-programmable gate array design is less than the logic capacity.

A family of field-programmable gate arrays produces advantages over the circuit of FIG. 1A. In effect, since the siblings have different types of connectivity schemes, the whole family of siblings may allow for more of the logic capacity to be used. FIGS. 1B–1C show a simplified diagram of designs for different siblings of an FPGA family. The number of tracks in some of the channels is increased and the number of tracks in other of the channels is decreased.

In FIG. 1B, more tracks are added to channels 40 and 42, and less tracks are used in channels 44, 46, 48 and 50. The design of FIG. 1B would be better for circuits having a high connectivity in the "middle" (type I). The design of FIG. 1B would be worse for circuits having high conductivity at the "edges" (type II). One would not want to use the design of FIG. 1B as the sole field-programmable gate array in the system, since a circuit to be implemented on the FPGA could be of type II. The system should implement type I and type II of circuits pretty well. The poor performance for type II circuits of the FPGA design of FIG. 1B would make the design of FIG. 1A a better choice as the sole FPGA design in the system.

FIG. 1C is a diagram of another sibling in which channels 52 and 54 near the edge of the FPGA are thicker and other channels 55, 56, 58 and 60 have fewer tracks. The design of FIG. 1C covers type II circuits well, and type I circuits poorly. Notice that a combination of the designs of FIG. 1A and FIG. 1C would cover type I and type II circuits pretty well. Note that the designs of FIG. 1B and 1C have fewer overall tracks than the design of FIG. 1A. This can result in a smaller-area FPGA, since the tracks with their associated programmable interconnects need not be provided. Smaller-area FPGA designs result in a cheaper overall chip.

The designs of FIGS. 1A–1C are simplified. The real FPGAs will have more channels and more logic blocks. Additional designs of FPGAs may be used in this specific family with other distributions of wires in the channels. The different field-programmable gate array designs will be chosen so that they implement different types of circuits well. The methodology for choosing different field-programmable gate array designs for use in a family is best described with respect to field-programmable gate arrays which use logic blocks connected together by hard-wired links.

Hard-wired Logic Blocks

Replacing some of the programmable connections in a field-programmable gate array with hard-wired connections, between logic blocks, produces advantages with field-programmable gate array families. The use of hard-wired connections is described in the paper Chung, et al.; "Using Hierarchical Logic Blocks to Improve the Speed of FPGAs"; *FPGAs;* W. Moore et al., ed.; Abington, 1991; pages 103–113; and Chung, "Architecture and Synthesis of Field-Programmable Gate Arrays with Hard-wired Connections"; *Ph.D. Dissertation, University of Toronto;* 1992; which are both incorporated herein by reference.

Since the metal wire incurs a much smaller delay and requires less area than a programmable connection, field-programmable gate arrays built using hard-wired connections between some of the logic blocks have the potential to be both faster and smaller than field-programmable gate arrays in which all the connections are programmable. FIG. 2A shows an example of a group of logic blocks used in a field-programmable gate array design in which some of the logic blocks are connected together by hard-wired links. Hard-wired link 62 connects the output of logic block 66 to the input of logic block 68. Hard-wired link 64 connects the output of logic block 68 to the input of logic block 70. The hard-wired link 62 also includes a buffered output so that the output of logic block 66 can be programmably connected to other logic blocks. An output of logic block 68 is also connected by a buffer 74 to a programmable connection. FIG. 2B shows the implementation of circuit design on a field-programmable gate array with purely programmable interconnections. FIG. 2C shows a diagram of the circuit implemented on a field-programmable gate array design that has hard-wired links between some of the logic blocks. The use of groups 80 and 82 in the design allows for faster interconnection of the logic elements. This may be important if the path such as the path between logic blocks A and C in groups 80 or 82 is a critical path. Note that portions 84 and 86 of groups can be used as shown in FIG. 2A, since the output of logic blocks 66 and 68 are buffered to a programmable connection at 72 and 74. The circuit implemented with the hard-wired connections, as shown in FIG. 2C, will be faster since it has replaced many of the slow programmable connections in the critical path with fast hard-wired ones. The effect of using hard-wired links on area is more difficult to predict. Since many programmable connections are replaced by simple wires, hard-wired connection implementations can be smaller than standard programmable interconnections. On the other hand, since the groups are more coarse-grained than the individual logic blocks of FIG. 2B, it is more difficult to utilize the groups fully, so that the area required by many circuits will increase. In practice, one finds that a hard-wired logic block that has a large number of hard-wired connections causes an increase in circuit area, while groups of logic blocks hard-wired together with only a few hard-wired connections can reduce the circuit area slightly compared to non-hard-wired implementations.

FIGS. 3A–3F illustrate the use of two different groups of logic blocks with the hard-wired connections in different siblings of field-programmable gate array families. FIG. 3A is a diagram of a group used in a sibling of a field-programmable gate array family similar to that shown in FIG. 2A. FIG. 3B is a group used in a second sibling of that field-programmable gate array family. In this grouping, the outputs of logic blocks E and F are hard-wired to the inputs of logic block G. FIG. 3C shows a circuit design that is best implemented in the sibling that contains a group shown in FIG. 3A. FIG. 3D shows a circuit design that is best implemented by the sibling that contains the groups shown in FIG. 3B. With the pattern of the group shown in FIG. 3A, the number of programmable connections for the circuit of FIG. 3C is greatly reduced compared to using the pattern of the group shown in FIG. 3B. As discussed above, using hard-wired connections rather than programmable connections reduces the circuit delay. Similarly, the circuit of FIG. 3D has more hard-wired connections when implemented with the sibling of FIG. 3B rather than the sibling of FIG. 3A.

FIGS. 3E and 3F are partial diagrams showing the hard-wired connections between the logic blocks so as to implement the groups shown in 3A and 3B on an FPGA. FIG. 3E shows two groups 90 and 92. Group 90 includes hard-wired connections 94' and 96'. FIG. 3E and 3F do not show the programmable connections. FIG. 3F shows the implementation of the groups of sibling 3B. Two groups, 98 and 100, are shown. In group 98, hard-wired connections 102' and 104' connect the output of logic blocks E and F to the input of logic block G. As above, the programmable connections are not shown. As shown in FIGS. 3C and 3D, some circuits route better onto sibling A than onto sibling B and vice versa.

Experimental Methodology

The results of the Chung Ph.D. dissertation are used to evaluate the density and speed improvements attainable by using the siblings concept to hard-wired connections between logic blocks. The results of technology mapping of fifteen benchmark circuits into 209 different hard-wired connection FPGA architectures are used to compare the potential families of FPGA designs. The logic blocks in the study are implemented as look-up tables. Each architecture is defined by the size of the look-up table (from two to seven inputs) and by the topology of the hard-wired connections between the look-up tables. For each architecture, we compute area and delay estimates for each circuit, and normalize them to those of the same circuit implemented in a four-input look-up table FPGA with no hard-wired connections. Four input look-up tables have previously been shown to be a good choice for an FPGA logic block architecture, and by normalizing our area and delaying results to it, we can average results from the circuits with a wide variety of sizes and logic depths in a meaningful way. All averaging is done with geometric averaging, since taking the arithmetic average of normalized numbers can lead to misleading results.

The delay and area of a family with only one sibling is taken as the geometric averages of that FPGA's delay and area metrics over the fifteen benchmark circuits, respectively. The speed of an FPGA is simply the reciprocal of the delay. In a family with more than one sibling, we define the "family score" on a circuit as the best area and/or delay metric achieved with any of the siblings on that circuit. Averaging this family score over the benchmark circuits yields the performance of this family.

To assess the improvement in the performance of a family as the number of siblings in a family is increased, we must find the best family with the given number of siblings that can be constructed from our pool of possible architectures. For families with three or fewer siblings, we exhaustively check the performance of all the possible families, so that we are guaranteed to find the best family. With 209 architectures to choose from, the number of possible families grows rapidly as the family size increases. Hence, for families with four or more siblings, we limit the search base by assuming that a family of size N consists of the best family of size N minus 1, plus one more sibling. Therefore, for four siblings, we may not have the absolute best family that can be constructed, but our investigations have shown that the family we obtain is either the best or one with only a slightly lower performance.

Area and Delay Models

The area and delay models used are deliberately kept simple in order to allow the evaluation of the FPGA architecture after technology mapping, i.e., no placement and routing step was undertaken. Note that only relative delay and area metrics are necessary in this study, since we are simply comparing architectures. The delay of the circuit implemented on an architecture consists of the logic block delay plus the delay incurred by the programmable interconnect on the critical path. The delay of the hard-wired connection is assumed to be essentially zero.

$$D_{Tot} = N_L \times D_{LB} + N_R \times D_R$$

$D_{Tot}$ is the total delay, while $N_R$ and $N_L$ are the number of programmable connections and the number of logic blocks on the critical path, respectively. $D_{LB}$ and $D_R$ are the delays of a logic block and of a programmable connection, respectively. The architectures studied were all based upon look-up tables with between two and seven inputs. The delays of the logic in the blocks have been defined with SPICE simulations of a 1.2 micron CMOS implementations, and are listed in Table 1.

TABLE 1

| Lookup Table Delays in a 1.2 μm CMOS Process | |
|---|---|
| # Inputs to LUT | $D_{LB}$ (ns) |
| 2 | 1.39 |
| 3 | 1.44 |
| 4 | 1.71 |
| 5 | 2.03 |
| 6 | 2.38 |
| 7 | 2.85 |

Choosing a value for $D_R$ is more problematic, since the delay of a programmable connection varies widely depending upon its fan-out and the number of routing switches through which it passes. We set $D_R$ to four nanoseconds, since in our experience this is a reasonable value for the type of FPGA architectures we are studying implemented in 1.2 micron CMOS.

Instead of referring to delay directly, we often refer to the speedup of one field-programmable gate array with respect to another. The speedup of FPGA of type A with respect to FPGA of type B is defined as:

$$\text{Speedup}_{AB} = \frac{\text{Delay}_B}{\text{Delay}_A}$$

The area of the logic blocks in a lookup table based FPGA is mostly static random access memory bits, while the routing area corresponds well with the total number of pins on the logic blocks. We therefore take the area of a circuit to be proportional to:

$$\text{Area} \propto N_{HLB}(HLB_{Bits} + Pinfac \times HLB_{pins} + FA \times HLB_{LUTs})$$

where $N_{HLB}$ is the number of hard-wired logic blocks required to implement the circuit and $HLB_{Bits}$, $HLB_{Pins}$, and $HLB_{LUTs}$ are the number of bits, pins and lookup tables per hard-wired logic block, respectively. A hard-wired logic block is a group of logic blocks connected together by the hard-wired links. Pinfac is the number of logic bit equivalent area units consumed by each pin, while FA is the number of logic bit equivalent area units required by the fixed resources (a D flip flop and output buffer) associated with these lookup tables. In a 1.2 micron CMOS process, FA is 3.4 while Pinfac is approximately 14 for the type of FPGA architectures we are studying.

Experimental Results

The technology mapping procedure can be set to produce either area- or delay-optimized circuits, and we tested the performance of the siblings on both types of circuits. For the area-mapped case, we chose sibling architectures to minimize the area of benchmark circuits. In the case of delay-mapped circuits, however, choosing sibling architecture to minimize delay alone produces a family with unacceptably large areas—typically about four times the area of non-hard-wired four lookup table implementations. Consequently, we chose siblings to minimize the sum of the area and delay for the delay-mapped circuits. This slows down the circuits only slightly, while reducing their area by a factor of approximately four.

FIGS. 4A and 4B show the speed and area improvements possible with siblings for both types of circuit mapping. In FIG. 4, we have normalized all our results to those obtained by the best single FPGA architecture (i.e., the one-sibling case) so that the performance improvement due to the increasing of the size of the family is immediately apparent. From FIG. 4, one sees that using a family of eight siblings would result in FPGAs that are 12.5 percent smaller and 20 percent faster than any single FPGA for the area-mapped case, and 1.5 percent smaller and 19 percent faster for the delay mapped case.

FIGS. 5 and 6 show FPGA architecture forming the best families with between one and three siblings for the area-mapped and delay-mapped circuits, respectively. The label on a lookup table denotes its size (number of inputs), heavy lines between lookup tables denote hard-wired connections from the output of one to the input of the next, and the lighter lines indicate programmable connections.

The most area-efficient hard-wired lookup block architecture shown in the one-sibling case of FIG. 5. Notice that it consists of two four-input lookup tables (four-input lookup tables have previously been shown to be very area-efficient), connected by one hard-wired connection. Since every lookup table must fan out, the technology mapper can usually make good use of this hard wire, so the area-efficiency of this architecture is not surprising.

As the number of siblings increases to two and three, larger lookup tables (seven-input and five-input lookup tables) tend to be selected, and the one sibling four-input lookup table hard-wired logic block is eventually replaced by a four-input lookup table hard-wired logic block which includes three hard-wired connections. The choice of siblings in which to implement a circuit helps to make up for the flexibility we lost as we moved towards coarser-grained logic blocks. Hence, the utilization of these larger logic blocks is high, and their lower routing area requirements translated to area efficient circuits.

FIG. 6 shows that a single six-input lookup table is the best architecture for simultaneously minimizing the area and delay of the delay-mapped circuits. While a six-input lookup table is less area-efficient than a four-input lookup table, it leads to faster circuits, and hence is a good choice when both area and delay must be minimized.

In FIG. 6, notice that when one goes from one to two siblings, a single six-input lookup table is replaced by a large seven-input lookup table hard-wired logic block, and a single five-input lookup table. The six-input lookup table has been replaced by one more coarse-grained hard-wired logic block, and one more fine-grained hard-wired logic block. Clearly, when forced to use only one general-purpose FPGA architecture, we had to compromise between the two- and the six-input lookup tables. Similarly, we can see from FIG. 1 that the single best FPGA architecture for area-mapped circuits (one sibling) is not one of the architectures shown for the three-sibling family; again, the single architecture was a compromise choice.

Tables 2 and 3 show the affect of varying $D_R$ and Pinfac over a wide range. Note that the perimeter we are optimizing, the area reduction for area-mapped circuits, and the sum of the area and delay reductions for the delay-mapped circuits, are fairly constant regardless of the value of $D_R$ and Pinfac. The sibling architectures chosen for each family change somewhat when the extreme values of $D_R$ and Pinfac are used in our delay and area models, but the trends observed as the family size increases are the same.

TABLE 2

Effect of Varying $D_R$ and Pinfac Parameters for Area-Mapped Circuits

| $D_R$ (ns) | Pinfac | 5 Sibling Area Improvement | 8 Sibling Area Improvement | 5 Sibling Speedup | 8 Sibling Speedup |
| --- | --- | --- | --- | --- | --- |
| 4.0 | 14 | 10.6% | 12.5% | 1.19 | 1.20 |
| 1.0 | 14 | 10.6% | 12.5% | 1.16 | 1.15 |
| 10.0 | 14 | 10.6% | 12.5% | 1.21 | 1.23 |
| 4.0 | 4 | 9.4% | 10.4% | 1.02 | 1.01 |
| 4.0 | 30 | 14.2% | 15.6% | 1.09 | 1.07 |

TABLE 3

Effect of Varying $D_R$ and Pinfac Parameters for Delay-Mapped Circuits

| $D_R$ (ns) | Pinfac | 5 Sibling Area Improvement | 8 Sibling Area Improvement | 5 Sibling Speedup | 8 Sibling Speedup |
| --- | --- | --- | --- | --- | --- |
| 4.0 | 14 | 10.3% | 11.5% | 1.15 | 1.19 |
| 1.0 | 14 | 11.7% | 12.0% | 1.07 | 1.09 |
| 10.0 | 14 | 6.0% | 8.7% | 1.30 | 1.32 |
| 4.0 | 4 | −0.5% | −0.9% | 1.23 | 1.31 |
| 4.0 | 30 | 2.9% | 6.1% | 1.24 | 1.25 |

We also conducted experiments in which both the area-mapped and delay-mapped circuits were implemented in a single family. This case is of interest because some applications may be limited by the capacity of an FPGA, while others are limited by its speed. Consequently, manufacturers may desire FPGA families capable of efficiently implementing circuits that have been optimized for either area or delay. In this case, we chose simply to minimize the sum of the area and delay, and found that a family with eight siblings was 13.7% smaller and 18% faster than the single best hard-wired logic block FPGA architecture for our benchmark circuits.

Heterogeneous Logic Block Architectures

FPGA families can also be composed of heterogeneous logic block architectures that use more than one type of logic blocks. The construction of an FPGA family for heterogeneous logic blocks can be done by choosing the appropriate number of siblings from a pool of possible architectures. The architectural pool used with heterogeneous logic block architectures consists of forty-five different FPGAs with a heterogeneous mixture of two different types of logic blocks. A heterogeneous logic block architecture that uses two different types logic blocks each having a different number of inputs is described in He, et al.; "Advantages of Heterogeneous Logic Block Architectures for FPGAs"; *Custom*

*Integrated Circuits Conference* 1993, pp. 7.4.1–7.4.5, May 1993; and He, "Technology Mapping and Architecture of Heterogeneous Field-Programmable Gate Arrays," *M.A.Sc. Thesis, University of Toronto*, 1994; both of which are incorporated herein by reference. The defining parameters for each FPGA are the size of the small lookup table (s), the size of the large lookup table (p), and the ratio of the number of small logic blocks to large logic blocks ($r=N_S/N_P$). FIGS. 7 and 8 show an example of a heterogeneous FPGA where p=4, s=2, and r=2. The architectures of the pool are used to create families of different possible heterogeneous logic block architectures with p valued between 3 and 7, s valued between 2 and 6, and r equal to 0.5, 1, or 2. The experimental procedures are similar to those described above, with two exceptions. First, we sought the family to minimize the area alone. Secondly, since we were using a pool of only forty-five architectures, it is feasible to exhaustively search all possible families of up to eight siblings in order to be sure of finding the best family. The gains provided by applying the siblings concept to this architectural axis are not as great as those obtained from hard-wired architectures. With eight siblings, we obtain only a six percent error reduction, even though we are choosing our families to strictly minimize area. Choosing the architectural differences between siblings wisely is crucial in obtaining the large density and performance gains as family size is increased. In order to assess the influence of Pinfac on these results, we let it vary from 4 to 30. FIG. 4 shows our results are not very sensitive to this parameter.

TABLE 4

Influence of Pinfac on Results

| Pinfac | 5 Sibling Area Improvement | 8 Sibling Area Improvement |
|---|---|---|
| 4 | 4.9% | 5.1% |
| 14 | 5.1% | 6.0% |
| 30 | 5.6% | 6.9% |

FIG. 9 shows an example with p equal to 7, s equal to 3, and r equal to 1. FIG. 10 shows an example with p equal to 5, s equal to 3, and r equal to 0.5.

Hierarchical Interconnect Structures

FIGS. 11–12 illustrate a hierarchical interconnect structure used with the field-programmable gate array. FIG. 11 is a partial diagram of a hierarchical interconnect structure. Logic blocks such as logic block 150, 152, 154 are connected by first level interconnect 156 to form a group 158. This group is connected to another group 160 by a second level interconnect 162. In the hierarchical interconnect of FIG. 11, three logic blocks are connected by first level interconnects and two groups are connected by second level interconnect. Additional levels of hierarchical interconnection (not shown) are also provided.

FIG. 12 shows a sibling to the hierarchical interconnect of FIG. 11. FIG. 12 is a partial diagram of the hierarchical interconnect showing logic blocks 164 and 166 connected together by an interconnect 170 to form a group 172. Groups 172, 174 and 176 are connected by a second level interconnect 178. In the hierarchical interconnect illustrated partially in FIG. 12, two logic blocks are connected by a first level interconnect, such as interconnect 170, and three groups are connected by the second level interconnect, such as interconnect 178. Arranging hierarchical interconnect of the different siblings in this manner can have the benefit that some circuits types may map better to the interconnect structure of FIG. 11, while other circuit types may map better to the interconnect in FIG. 12.

Other Embodiments

Other possible changes that can be made to siblings include varying a segmented routing architecture. Some architectures have tracks that contain a switch which can connect together or isolate segments of the tracks. Siblings can have different patterns of connection switches.

Additionally, families could be produced that reduce flexibility by coding schemes that control the interconnect structures with many fewer bits of the storage structures. Different coding schemes will produce different siblings in a families. This will require a placement and routing tool tightly coupled to the architecture family.

Finally, finding combinations of all the different changes for the families described above that work in the same "direction" (supporting the same types of circuits) could be used to produce a small number of siblings that provide a larger gain in speed and reduced area.

FIG. 13 is a flow chart showing the method of the present invention. As described above, step 180 involves providing a series of field-programmable gate arrays of different designs. Each design is chosen to implement a specific set of subsets of possible circuits. Step 182 involves providing the desired circuit of which to implement on an FPGA. Step 184 is an optional step of optimizing the desired circuit regardless of its eventual implementation. This involves removing redundancies, consolidating logic, etc.

Step 186 involves performing logic synthesis to the optimized circuit design so that the structures of the optimized circuit are converted to the logic block implementation/implementations of the field-programmable gate array design. This logic synthesis step is done with software such as that provided by the Exemplar or Synopsys company. This step may be sufficient to allow for the choice of a selected FPGA design in some cases.

Step 188 involves attempting to place and route the converted circuit design onto different FPGA designs. Standard placement and routing software can be used to do this. Minor changes to the software will allow for the placement and routing onto different architectures. S. Brown, et al., "A Detailed Router for Field Programmable Gate Arrays", *IEEE Transactions on Computer Aided Design*, Volume 11, No. 5, May 1992, incorporated herein by reference, gives an example of modifying a placement and routing software. A simplistic way to do a global routing onto different sibling architectures would be to do a general global routing and then check which sibling architectures can support the result.

If a circuit design would fit onto more than one FPGA, in step 192 any FPGA is selected. More preferably, the FPGA that produces the lowest delay for a given circuit design would be selected. In step 194, if the circuit fits on only one FPGA, that FPGA design is selected. Finally, the circuit is placed and routed onto a selected FPGA in step 196.

Various details of the implementation and method are merely illustrative of the invention. It will be understood that various changes in details may be within the scope of the invention, which is to be limited only by the appended claims.

What is claimed is:

1. A method of implementing a digital circuit on a field-programmable gate array comprising the steps of:

providing a series of field-programmable gate arrays of different designs, at least two of the designs having the same logic capacity, and the designs having sufficient logic capacity to implement the digital circuit wherein the designs are devised such that each design can advantageously implement a subset of all circuit types;

determining the logic synthesis of the digital circuit into each of the field-programmable gate array designs;

determining the subsequent placement and routing of the digital circuit into the different designs to select a preferred design of the field-programmable gate arrays for the digital circuit; and implementing the digital circuit on a field-programmable gate array of the preferred design.

2. The method of claim 1, wherein the providing step is such that each design is devised so that its respective subset of circuit designs can be implemented with a low delay.

3. The method of claim 1, wherein the providing step is such that each of the designs of the field-programmable gate arrays has the same logic capacity.

4. The method of claim 1, wherein the determining step includes optimizing of the circuit and technology mapping for the logic blocks of the designs.

5. The method of claim 1, wherein the determining step includes the step of choosing the field-programmable gate array with the design that implements the circuit so that the circuit has the lowest delay.

6. The method of claim 1, wherein the determining step includes the step of choosing the field-programmable gate array that succeeds in routing the circuit onto the chip.

7. The method of claim 6, wherein the providing step is such that the field-programmable gate arrays of different designs have the same silicon area.

8. The method of claim 1, wherein the providing step is such that the logic blocks are implemented as look-up tables.

9. The method of claim 1, wherein the providing step is such that the logic blocks of some of the designs have different number of inputs.

10. The method of claim 1, wherein the providing step is such that at least some of the different designs have different patterns of hard-wired connections between logic blocks, said designs also including programmable connections between the logic blocks.

11. The method of claim 10, wherein the providing step is such that at least one of the designs includes multiple groups of more than one logic block, the groups having the same pattern of hard-wired connections between the inputs and outputs of the logic blocks in the group.

12. The method of claim 11, wherein the providing step is such that one design has a group that comprises three logic blocks wherein the pattern of hard-wired connections between the members in the group comprises a hard-wired connection between an output of a first logic block and an input of a second logic block, and a hard-wired connection between an output of a second logic block and an input of a third logic block.

13. The method of claim 11, wherein the providing step is such that one design has a group that comprises three or more logic blocks wherein the pattern of hard-wired connections between the members in the group comprises hard-wired connections between inputs of a first logic block of the group and the outputs of the other logic blocks in the group.

14. The method of claim 1, wherein the providing step is such that at least two of the field-programmable gate arrays have a hierarchical interconnect structure, the first hierarchical interconnect structure design comprising a number of logic blocks connected together with a first level interconnect to form a group and a second number of groups is connected by a second level interconnect, the second hierarchical interconnect structure design comprising a third number of logic blocks connected together with a first level interconnect to form a group and a fourth number of groups is connected by a second level interconnect, wherein the number of logic blocks connected together with a first level interconnect of the first hierarchical interconnect structure design is different than the third number of logic blocks connected together with the first level interconnect of the second hierarchical interconnect structure design.

15. The method of claim 14, wherein the providing step is such that the first hierarchical interconnect structure design has the same total number of logic blocks as the second hierarchical interconnect structure design.

16. The method of claim 14, wherein the providing step is such that the second number of groups connected together with second level interconnect of the first hierarchical interconnect structure design is different than the fourth number of groups connected together with the second level interconnect of the second hierarchical interconnect structure design.

17. The method of claim 1, wherein the providing step is such that at least two of the field-programmable gate arrays are designed in arrays having at least two parallel channels containing sets of routing wires, wherein the distribution of tracks in the channels of the first design is different than the distribution of tracks in the channels of the second design.

18. The method of claim 17, wherein the providing step is such that the at least two of the field-programmable gate arrays are designed in arrays having at least three parallel channels containing sets of routing wires, the channels comprising two outer channels and a middle channel, wherein the middle channel of the first design has more wires than the middle channel of the second design.

19. The method of claim 17, wherein the providing step is such that the first and second design have the same number of total tracks.

20. The method of claim 19, wherein the providing step is such that the first and second design have the same number of logic blocks.

21. The method of claim 1, wherein the providing step is such that at least one of the field-programmable gate arrays is designed with two types of logic blocks having different numbers of inputs.

22. The method of claim 1, wherein the providing step is such that at least two of the field-programmable gate arrays have logic blocks, the first design having a type of logic block with a certain number of inputs not found in the second design.

23. The method of claim 1, wherein the providing step is such that at least two of the field-programmable gate arrays have logic blocks with different numbers of inputs, the two designs having a first type of logic block with one number of inputs and a second type of logic block with a second number of inputs, the first design having a ratio of the number of the first type of logic blocks over the number of second type of logic blocks which is different than this ratio for the second design.

24. A method of implementing a digital circuit on a field-programmable gate array comprising the steps of:

providing a series of field-programmable gate arrays of different designs, each design having logic blocks, wherein at least some of the different designs have different patterns of hard-wired connections between logic blocks, said designs also including programmable connections between the logic blocks;

determining the subsequent placement and routing of the digital circuit into the different designs to select a preferred design of the field-programmable gate arrays for the digital circuit; and implementing the digital circuit on a field-programmable gate array of the preferred design.

25. The method of claim 24, wherein the providing step is such that at least one of the designs includes multiple groups of more than one logic blocks, the groups having the same pattern of hard-wired connections between the inputs and outputs of the logic blocks in the group.

26. The method of claim 25, wherein the providing step is such that one design has a group that comprises three logic blocks wherein the pattern of hard-wired connections between the members in the group comprises a hard-wired connection between an output of a first logic block and an input of a second logic block, and a hard-wired connection between an output of second logic block and an input of third logic block.

27. The method of claim 25, wherein the providing step is such that one design has a group that comprises three or more logic blocks wherein the pattern of hard-wired connections between the members in the group comprises hard-wired connections between inputs of a first logic block of the group and the outputs of the other logic blocks in the group.

28. A method of implementing a digital circuit on a field-programmable gate array comprising the steps of:

providing a series of field-programmable gate arrays of different designs, each design having logic blocks, wherein at least two of the field-programmable gate arrays are designed in hierarchical interconnect structures, the first hierarchical interconnect structure design comprising a number of logic blocks connected together with a first level interconnect to form a group and a second number of groups is connected by a second level interconnect, the second hierarchical interconnect structure design comprising a third number of logic blocks connected together with a first level interconnect to form a group and a fourth number of groups is connected by a second level interconnect, wherein the number of logic blocks connected together with the first level interconnect of the first hierarchical interconnect structure design is different than the third number of logic blocks connected together with the first level interconnect of the second hierarchical interconnect structure design;

determining the subsequent placement and routing of the digital circuit into the different designs to select a preferred design of the field-programmable gate arrays for the digital circuit; and implementing the digital circuit on a field-programmable gate array of the preferred design.

29. The method of claim 28, wherein the providing step is such that the first hierarchical interconnect structure design has the same total number of logic blocks as the second hierarchical interconnect structure design.

30. The method of claim 28, wherein the providing step is such that the second number of groups connected together with a second level interconnect of the first hierarchical interconnect structure design is different than fourth number of groups connected together with the second level interconnect of the second hierarchical interconnect structure design.

31. A method of implementing a digital circuit on a field-programmable gate array comprising the steps of:

providing a series of field-programmable gate arrays of different designs, each design having logic blocks, wherein at least two of the field-programmable gate arrays are designed in arrays having at least two parallel channels containing sets of routing wires, wherein the distribution of wires in the first design is different than the distribution of wires in the second design;

determining the subsequent placement and routing of the digital circuit into the different designs to select a preferred design of the field-programmable gate arrays for the digital circuit; and implementing the digital circuit on a field-programmable gate array of the preferred design.

32. The method of claim 31, wherein the providing step is such that the at least two of the field-programmable gate arrays are designed in arrays having at least three parallel channels containing sets of routing wires, the channels comprising two outer channels and a middle channel, wherein the middle channel of the first design has more wires than the middle channel of the second design.

33. The method of claim 32, wherein the providing step is such that the at least two of the field-programmable gate arrays are designed in arrays having at least three parallel channels containing sets of routing wires, the channels comprising two outer channels and a middle channel, wherein the middle channel of the first design has more wires than one of the outer channels of the first design.

34. A method of implementing a digital circuit on a field-programmable gate array comprising the steps of:

providing a series of field-programmable gate arrays of different designs, each design having logic blocks, wherein at least two of the field-programmable gate arrays have logic blocks, the first design having a type of logic blocks having a number of inputs not found in the second design;

determining the subsequent placement and routing of the digital circuit into the different designs to select a preferred design of the field-programmable gate arrays for the digital circuit; and implementing the digital circuit on a field-programmable gate array of the preferred design.

35. A method of implementing a digital circuit on a field-programmable gate array comprising the steps of:

providing a series of field-programmable gate arrays of different designs, each design having logic blocks, wherein at least two of the field-programmable gate arrays has logic blocks, the two designs having a first type of logic block with one number of inputs and a second type of logic block with a second number of inputs, the first design having a ratio of the number of the first type of logic blocks over the number of second type of logic blocks than the second design;

determining the subsequent placement and routing of the digital circuit into the different designs to select a preferred design of the field-programmable gate arrays for the digital circuit; and implementing the digital circuit on a field-programmable gate array of the preferred design.

36. A method of implementing a digital circuit on a field-programmable gate array comprising the steps of:

providing a series of field-programmable gate arrays of different designs, at least two of the designs having the same logic capacity, and the designs having sufficient logic capacity to implement the digital circuit wherein the designs are devised such that each design can advantageously implement a subset of all circuit types;

determining the logic synthesis of the digital circuit into each of the field-programmable gate array designs;

determining a preferred design of the field-programmable gate arrays for the digital circuit from the logic synthesis for each of the field-programmable gate array designs; and implementing the digital circuit on a field-programmable gate array of the preferred design.

37. A method of implementing a digital circuit on a field-programmable gate array comprising the steps of:

providing a series of field-programmable gate arrays of different designs;

determining the logic synthesis of the digital circuit into each of the field-programmable gate array designs;

determining the subsequent placement and routing of the digital circuit into the different designs to select a preferred design of the field-programmable gate arrays for the digital circuit; and implementing the digital circuit on a single field-programmable gate array of the preferred design, 38. A method of implementing a digital circuit on a field-programmable gate array comprising the steps of:

providing a series of field-programmable gate arrays of different designs;

determining the logic synthesis of the digital circuit into each of the field-programmable gate array designs;

determining the subsequent placement and routing of the digital circuit into the different designs to select a preferred design of the field-programmable gate arrays for the digital circuit; and implementing the digital circuit on a field-programmable gate array of the preferred design;

determining the logic synthesis of a second digital circuit into each of the field-programmable gate array designs;

determining the subsequent placement and routing of the different designs to select a different preferred design of the field-programmable gate arrays for the second digital circuit; and implementing the second digital circuit on a field-programmable gate array of the different preferred design.

* * * * *